US009123825B2

(12) United States Patent
Beyer et al.

(10) Patent No.: US 9,123,825 B2
(45) Date of Patent: Sep. 1, 2015

(54) METHODS FOR FABRICATING FINFET INTEGRATED CIRCUITS USING LASER INTERFERENCE LITHOGRAPHY TECHNIQUES

(71) Applicant: GLOBALFOUNDRIES, Inc., Grand Cayman (KY)

(72) Inventors: Sven Beyer, Dresden (DE); Alexander Ebermann, Dresden (DE); Carsten Grass, Dresden (DE); Jan Hoentschel, Dresden (DE)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/153,521

(22) Filed: Jan. 13, 2014

(65) Prior Publication Data
US 2015/0200140 A1 Jul. 16, 2015

(51) Int. Cl.
| | |
|---|---|
| *H01L 21/8234* | (2006.01) |
| *H01L 21/027* | (2006.01) |
| *H01L 21/306* | (2006.01) |
| *H01L 21/02* | (2006.01) |
| *H01L 21/3105* | (2006.01) |
| *H01L 21/3065* | (2006.01) |
| *H01L 21/28* | (2006.01) |
| *H01L 21/311* | (2006.01) |

(52) U.S. Cl.
CPC .... *H01L 21/823431* (2013.01); *H01L 21/0275* (2013.01); *H01L 21/02164* (2013.01); *H01L 21/02172* (2013.01); *H01L 21/28176* (2013.01); *H01L 21/3065* (2013.01); *H01L 21/30604* (2013.01); *H01L 21/31053* (2013.01); *H01L 21/31111* (2013.01); *H01L 21/823437* (2013.01)

(58) Field of Classification Search
CPC ............ H01L 29/785; H01L 29/66795; H01L 21/76224; H01L 21/02107; H01L 24/24; H01L 24/25; H01L 21/823431; H01L 21/0275; H01L 21/30604; H01L 21/02172; H01L 21/31053; H01L 21/3065; H01L 21/02164; H01L 21/28276; H01L 21/823437; H01L 21/31111
See application file for complete search history.

(56) References Cited

U.S. PATENT DOCUMENTS

| | | | |
|---|---|---|---|
| 2013/0105937 A1 | 5/2013 | Niroomand et al. | |
| 2013/0214876 A1* | 8/2013 | Lee et al. | 333/186 |
| 2015/0024561 A1* | 1/2015 | Li et al. | 438/222 |

FOREIGN PATENT DOCUMENTS

EP  1630615 A2  3/2006

* cited by examiner

*Primary Examiner* — Yasser A Abdelaziez
*Assistant Examiner* — Farun Lu
(74) *Attorney, Agent, or Firm* — Ingrassia Fisher & Lorenz, P.C.

(57) ABSTRACT

A method for fabricating an integrated circuit includes providing a semiconductor substrate with a pad layer overlying the semiconductor substrate and a photoresist layer overlying the pad layer, exposing the photoresist layer to a split laser beam to form a plurality of parallel linear void regions in the photoresist layer, and etching the pad layer and the semiconductor substrate beneath the plurality of parallel linear void regions to form a plurality of extended parallel linear void regions. The method further includes depositing a first dielectric material over the semiconductor substrate, patterning a photoresist material over the semiconductor substrate to cover a portion of the semiconductor substrate, and etching portions of the pad layer, the first dielectric material, and the semiconductor substrate. Still further, the method includes depositing a second dielectric material into the second void regions.

20 Claims, 8 Drawing Sheets

METHODS FOR FABRICATING FINFET INTEGRATED CIRCUITS USING LASER INTERFERENCE LITHOGRAPHY TECHNIQUES

TECHNICAL FIELD

The present disclosure generally relates to methods for fabricating integrated circuits. More particularly, the presented disclosure relates to methods for fabricating FinFET integrated circuits using laser interference lithography (LIL) techniques.

BACKGROUND

The majority of present day integrated circuits (ICs) are implemented by using a plurality of interconnected field effect transistors (FETs), also called metal oxide semiconductor field effect transistors (MOSFETs), or simply MOS transistors. A typical planar MOS transistor includes a gate electrode as a control electrode formed over a semiconductive substrate, and spaced apart source and drain electrodes within the substrate between which a current can flow. A control voltage applied to the gate electrode controls the flow of current through a channel in the semiconductive substrate between the source and drain electrodes.

In contrast to traditional planar (MOSFETs), which are fabricated using conventional lithographic fabrication methods, non-planar MOSFETs incorporate various vertical transistor structures, and typically include two or more gate structures formed in parallel. One such semiconductor device is the "FinFET," which takes its name from the multiple thin silicon "fins" that are used to form the respective gate channels, and which are typically on the order of tens of nanometers in width.

As the size of the electrical devices that form the IC are made smaller and smaller, ever greater demands are placed on the techniques used to form these features, particularly the fins of a FinFET device. For example, photolithography is commonly used to pattern device features, such as conductive lines, on a substrate. "Pitch" is the center-to-center distance between features of an integrated circuit such as fins. Due to optical factors such as light or radiation wavelength, however, photolithography techniques have a minimum pitch below which features cannot be formed reliably. Thus, the minimum pitch of a photolithographic technique can limit feature size reduction.

One technique commonly used for extending the capabilities of photolithographic techniques beyond their minimum pitch to form more closely spaced fins is the "pitch doubling" technique. In this technique, photolithography is first used to form a pattern of lines in a photoresist layer overlying a layer of a temporary or expendable material and a substrate. Common wavelengths that are used in performing the photolithography include, but are not limited to, 157 nm, 193 nm, 248 nm or 365 nm. Before performing subsequent processing steps, the lines are optionally shrunk using an isotropic etch. The pattern is then transferred by an etch step, such as an anisotropic etch step, to the layer of expendable material, thereby forming placeholders or mandrels. The photoresist lines can be stripped and the mandrels can be isotropically etched to increase the distance between neighboring mandrels. A layer of spacer material is subsequently deposited over the mandrels. Spacers are then formed on the sides of the mandrels by preferentially etching the spacer material from the horizontal surfaces in a directional spacer etch. The remaining mandrels are then removed, leaving behind only the spacers, which together act as a mask for patterning. Thus, where a given pattern area formerly defined one feature and one space (each having a width F, for a pitch of 2F), the same pattern area now includes two features and two spaces, as defined by the spacers (each having a width ½F, for a pitch of F). Consequently, the smallest feature size possible with a photolithographic technique is effectively decreased by using the pitch doubling technique.

While pitch of the fins is actually reduced using these techniques, this reduction in pitch is conventionally referred to as "pitch doubling", or more generally, "pitch multiplication". This is because these techniques allow the number of features in a given region of the substrate to be doubled, or more generally, multiplied. Thus, using the conventional terminology, "multiplication" of pitch by a certain factor actually involves reducing the pitch by that factor. By forming multiple layers of spacers upon each other, the definable feature size can be made even smaller. Thus, the terms "pitch multiplication" and "pitch doubling" refer to the process generally, regardless of the number of times the spacer formation process is employed.

Pitch multiplication techniques, however, are cost and time prohibitive for many fabrication applications. Pitch multiplication techniques are also very sensitive to process variations, which may result in a high device failure rate. Thus, alternatives to pitch multiplication techniques are constantly being sought for fabricating FinFET ICs with sub-lithographic features.

One alternative technique that has previously been employed in small-scale fabrication applications (for example, single wafer research and testing) is laser interference lithography (LIL), also known as interferometric lithography. In interferometric lithographic systems, a laser beam is sent into a beam splitter, the beam splitter divides the laser beam, and then the laser beam is recombined at a substrate that is being exposed, to form a pattern. Typically the patterns being formed involve lines, or rulings (also referred to as "stripes"), which are used to test such components as photoresist, etc. Thus, in an interferometric lithographic system, two laser beams are coherently matched, to form fringes at the substrate plane. The fringe pattern exposes the photoresist, which forms a type of a grating pattern. Different interferometric lithographic systems have different ways of generating the two laser beams that will ultimately produce the interference fringes at the substrate.

In conventional interferometric lithographic systems, in order to change the resolution of the system, it is generally necessary to change a number of parameters of the optical system. Typically, this involves replacing some elements of the optics modules. This procedure can be time consuming. Additionally, replacing optical elements or components frequently requires realignment of the components, further increasing the time that the procedure requires. For example, one of the parameters that needs to change in order to change the resolution of the system is the angle at which the laser beams strike the substrate. This may be viewed as analogous to changing the numerical aperture of the optical system (although, since lenses are not involved in formation of the image in interferometric systems, the numerical aperture at issue is more of a derivative concept).

Other parameters that may need to be changed involve how the beams are separated, and the alignment of various optical components needed to produce the interference fringes. Because of the relatively small coherence length of the laser, there is generally little room for the optical designer to work with, in making sure that the two laser beams actually form the required fringes. In other words, the alignments have to be exact, which is often very difficult to achieve in practical systems, particularly where optical components have to be swapped in and out of the system. Having changeable optical elements drives the system complexity and cost upward. Each time a user has to change a beam splitter or an optical module, there is risk of losing critical alignments. Further, LIL methods can only produce a regular stripe pattern, not any of the complex shapes and patterns, such as fin patterns in a FinFET IC, typically required in commercially viable IC designs. Thus, as noted above, LIL has been largely limited to experimental and research applications.

Accordingly, it is desirable to provide improved methods for fabricating FinFET integrated circuits including sub-lithographic features. Additionally, it is desirable to provide methods for patterning a substrate using laser interference lithography that is useful to form complex and irregular fin patterns. Furthermore, other desirable features and characteristics of the present disclosure will become apparent from the subsequent detailed description and the appended claims, taken in conjunction with the accompanying drawings and the foregoing technical field and background.

BRIEF SUMMARY

Various exemplary methods for fabricating integrated circuits are provided herein. In one exemplary embodiment, a method for fabricating an integrated circuit includes providing a semiconductor substrate with a pad layer overlying the semiconductor substrate and a photoresist layer overlying the pad layer, exposing the photoresist layer to a split laser beam to form a plurality of parallel linear void regions in the photoresist layer, and etching the pad layer and the semiconductor substrate beneath the plurality of parallel linear void regions to form a plurality of extended parallel linear void regions. The method further includes depositing a first dielectric material over the semiconductor substrate to fill the extended parallel linear void regions with the first dielectric material, patterning a photoresist material over the semiconductor substrate to cover a portion of the semiconductor substrate, and etching portions of the pad layer, the first dielectric material, and the semiconductor substrate not covered by the photoresist material to form second void regions. Still further, the method includes depositing a second dielectric material into the second void regions and removing the pad layer to expose the semiconductor substrate outside of the second void regions.

In another exemplary embodiment, a method for fabricating an integrated circuit includes exposing a semiconductor substrate to a laser interference lithography line patterning process to form a plurality of parallel fin structures, each fin structure of the plurality of parallel fin structures being separated from an adjacent fin structure by a linear void region of a plurality of linear void regions and forming a first dielectric material over the semiconductor substrate and into the plurality of parallel linear void regions such that the first dielectric material partially fills the parallel linear void regions with the first dielectric material. The method further includes etching portions of the first dielectric material and the semiconductor substrate to form second void regions, wherein portion of the semiconductor substrate outside of the second void regions for active regions of the integrated circuit and forming a second dielectric material into the second void regions such that the second dielectric material partially fills the second void regions with the second dielectric material.

In yet another exemplary embodiment, a method for fabricating an integrated circuit includes providing a semiconductor substrate with a pad oxide layer and a pad nitride layer overlying the semiconductor substrate and a photoresist layer overlying the pad oxide and pad nitride layers, exposing the photoresist layer to a split laser beam to form a plurality of parallel linear void regions in the photoresist layer, and etching the pad oxide and pad nitride layers and the semiconductor substrate beneath the plurality of parallel linear void regions to form a plurality of extended parallel linear void regions. The method further includes depositing a first silicon oxide dielectric material over the semiconductor substrate and into the extended parallel linear void regions to fill the extended parallel linear void regions with the first silicon oxide dielectric material, planarizing the first silicon oxide dielectric material subsequent to depositing the first dielectric material over the semiconductor substrate to fill the extended parallel linear void regions to form a planar surface including parallel linear first silicon oxide dielectric material regions between parallel linear pad material regions, and depositing and patterning a photoresist material over the semiconductor substrate to cover a plurality of regions of the semiconductor substrate, the plurality of regions defining active regions of the integrated circuit. Still further, the method includes etching portions of the pad oxide and pad nitride layers, the first silicon oxide dielectric material, and the semiconductor substrate not covered by the photoresist material to form second void regions, depositing a second silicon oxide dielectric material into the second void regions to fill the second void regions, and planarizing the second silicon oxide dielectric material subsequent to depositing the second dielectric material to form a planar surface including second silicon oxide dielectric material regions, pad material regions, and first dielectric material regions. Still further, the method includes etching a first portion of both the first and second dielectric materials to re-form a portion of each of the plurality of extended parallel linear void regions and a portion of each of the second void regions, wherein a second portion of both the first and second dielectric materials remains in each of the plurality of extended parallel linear void regions and in each of the second void regions, removing the pad oxide and pad nitride layers to expose the semiconductor substrate outside of the filled second void regions, and forming a plurality of gate electrodes over the exposed semiconductor substrate.

BRIEF DESCRIPTION OF THE DRAWINGS

The various embodiments will hereinafter be described in conjunction with the following drawing figures, wherein like numerals denote like elements, and wherein:

FIGS. 6A-15A are top views of the integrated circuit and the method of FIG. 5 in accordance with an exemplary embodiment; and FIGS. 6B-15B are cross-sectional views of the integrated circuit and method of FIG. 6A-15A.

DETAILED DESCRIPTION

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are directed to methods for fabricating FinFET integrated circuit devices. The exemplary methods employ laser interference lithography to form a "stripe" pattern on a semiconductor substrate, and then employ a series of subsequent patterning steps to form FinFET regions on the semiconductor substrate in accordance with an IC layout design. In this manner, the smaller pitch features available from LIL techniques can be employed to fabricate semiconductors in a high-throughput semiconductor fabrication environment.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor based transistors are well known and so, in the interest of brevity, many conventional steps will only be mentioned briefly herein or will be omitted entirely without providing the well-known process details.

The techniques and technologies described herein may be utilized to fabricate MOS transistor devices, including N-channel MOS transistor devices (NMOS transistor devices), P-channel transistor devices (PMOS transistor devices), and complimentary MOS transistor devices (CMOS transistor devices) with both NMOS and PMOS transistor devices. In particular, the process steps described here may be utilized in conjunction with any semiconductor device fabrication process that forms gate structures for transistors. Although the term "MOS device" properly refers to a device having a metal gate electrode and an oxide gate insulator, that term will be used throughout this disclosure to refer to any semiconductor device that includes three-dimensional or "fin"-type transistor structures.

Figure 1:
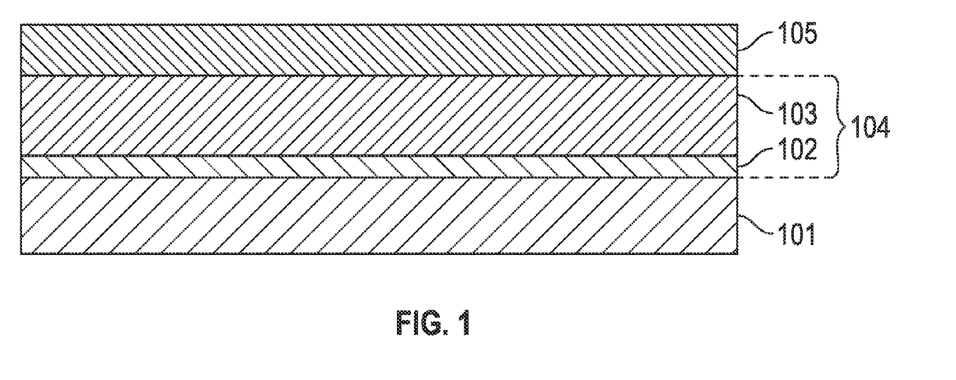
FIGS. 1-5 illustrate, in cross section, an integrated circuit structure and a method for fabricating the integrated circuit structure in accordance with various embodiments of the present disclosure.

FIG. 1 is a simplified view of an illustrative semiconductor device at an early stage of manufacturing. The semiconductor device is formed above an illustrative bulk semiconductor substrate 101. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. The semiconductor material is preferably a silicon substrate. The substrate 101 may have a variety of configurations, such as the depicted bulk silicon configuration. The substrate 101 may also have a silicon-on-insulator (SOI) configuration that includes a bulk silicon layer, an overlying buried insulation layer, and an overlying active layer, wherein semiconductor devices are formed in and above the active layer. As used herein, the term "overlying" means "on" such that a first layer on a second layer is in physical contact with the second layer and "over" such that when a first layer is over a second layer a third layer may be interposed between the two. Thus, the terms substrate or semiconductor substrate should be understood to cover all forms of semiconductor structures.

In FIG. 1, the device is depicted at the point of fabrication where an illustrative protection layer 102, for example, a screen or pad oxide layer, and a polish stop layer 103, for example, a pad nitride layer, have been formed overlying the substrate 101. Together, the protection layer 102 and the polish stop layer 103 form a pad layer 104. Also depicted in FIG. 1 is a mask layer 105, for example, a photoresist mask that may be formed using traditional photolithography tools and techniques. In one illustrative example, the protection layer 102 may be a pad oxide layer having a thickness on the order of about 10 nm, and it may be formed by performing a thermal growth process. In one illustrative example, the polish stop layer 103 may be a pad nitride layer having a thickness of about 80 nm, and it may be formed by performing a chemical vapor deposition (CVD) process.

Figure 2:
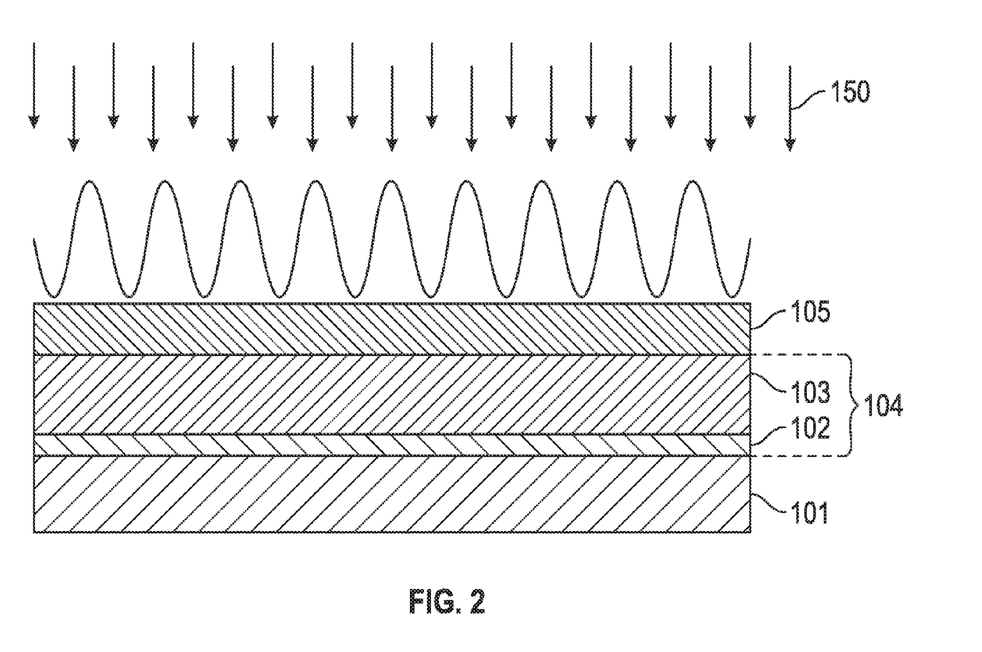

FIG. 2 illustrates the application of a laser interference lithography (LIL) process to the device depicted in FIG. 1. The LIL process involves the use of a multifaceted pyramidal prism and a movable beam splitter. The prism is mounted in an optical path that has an optical axis. The optical axis may be thought of as the Z axis of the system. The beam splitter is positioned further upstream in the optical path. The prism is mounted above the substrate, and usually a liquid is circulated between the prism and the wafer, if the system is an immersion lithographic system. It should be noted that the various embodiments are not limited to immersion lithographic systems, but may also be used with air or other gas between the prism and the wafer. Shown in FIG. 2 is a laser beam, which is split by the (not illustrated) beam splitter into two or more beams. The beams, upon traversing the beam splitter, then enter the (not illustrated) prism, and internally reflect off of one of the surfaces thereof. The beams then form interference fringes 150 on the substrate, as shown by the wave-pattern line over the photoresist mask layer 105.

Figure 3:
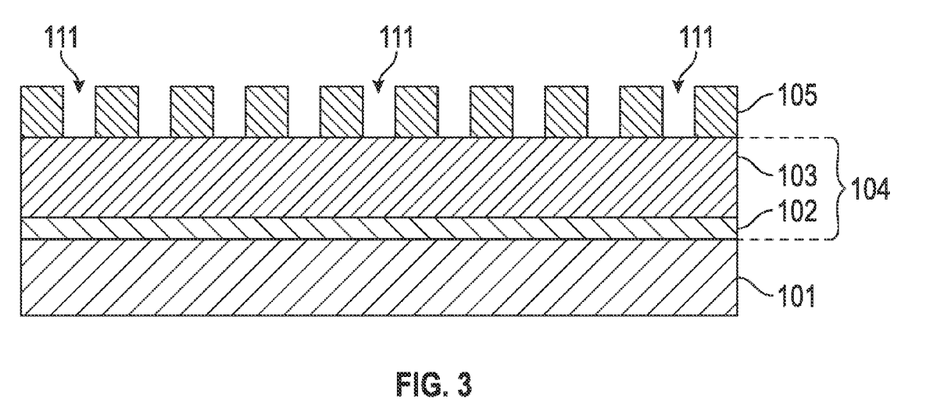

In this manner, as shown in FIG. 3, upon appropriate development of the photoresist material, the photoresist mask layer 105 is patterned with the characteristic "stripe" pattern described above that is produced as a result of LIL processes. In particular, the pattern includes a plurality of parallel, regularly spaced linear features separated from one another by a plurality of linear, parallel, regularly spaced void regions ("voids") 111. The pitch of the linear features may be sub-resolution as a result of the LIL process, and may be from about 5 nm to about 50 nm, for example about 10 nm, 14 nm, 22 nm, 32 nm, or any other sub-resolution semiconductor feature pitch.

Figure 4:
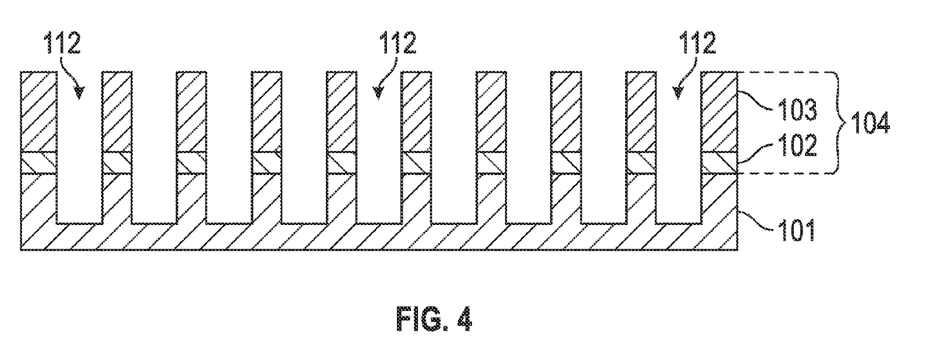

Referring now to FIG. 4, the developed pattern in the photoresist is transferred to the semiconductor device, and in particular layers 101, 102, and 103 thereof, by employing a suitable anisotropic etching technique. In one example, reactive ion etching (RIE) may be employed. RIE uses chemically reactive plasma to remove material deposited on substrate, including the pad nitride material of layer 103 and the pad oxide of material layer 102, and including the semiconductor substrate 101 material. The plasma is generated under low pressure (vacuum) by an electromagnetic field. High-energy ions from the plasma attack the wafer surface and react with it, thereby extending the pattern of the photoresist layer 105 to form deeper voids 112. The voids 112 extend completely through pad layers 102 and 103, and partially into substrate layer 101, for example about 5 nm to about 30 nm into substrate layer 101. A plurality of parallel structures may be formed in the semiconductor substrate in this manner; these parallel structures form the basis of the fins in the FinFET structure to be formed.

Figure 5:
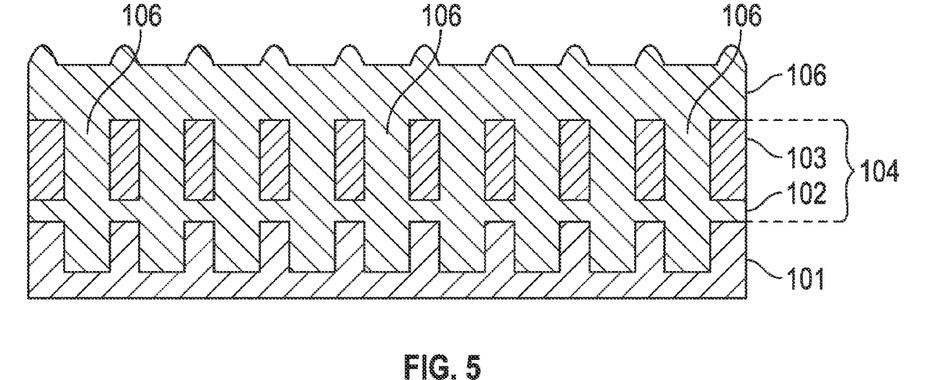

Subsequently, as shown in FIG. 5, the method continues with filling the voids 112 with an oxide material 106. Due to the decreased pitch, the voids 112 have a high aspect ratio. Thus, it is preferred to use an oxide filling technique that is capable of filling high aspect ratio voids in order to prevent gaps or seams from forming in the oxide material 106. In one example, the oxide material may be provided using high density plasma (HDP) oxide deposition. Typical HDP deposition processes employ chemical vapor deposition (CVD) with a gas mixture containing oxygen, silane, and inert gases, such as argon, to achieve simultaneous dielectric etching and deposition. In an HDP process, a radio frequency (RF) bias is applied to a wafer substrate in a reaction chamber. Some of these gas molecules (particularly argon) are ionized in the plasma and accelerate toward the wafer surface when the RF bias is applied to the substrate. Material is thereby sputtered when the ions strike the surface. As a result, dielectric material deposited on the wafer surface is simultaneously sputter etched to help keep gaps open during the deposition process, which allows higher aspect ratio gaps to be filled.

Figure 6A:
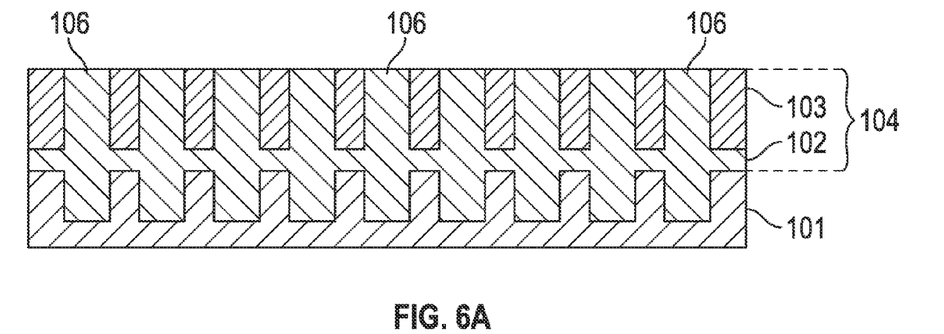
Figure 6B:
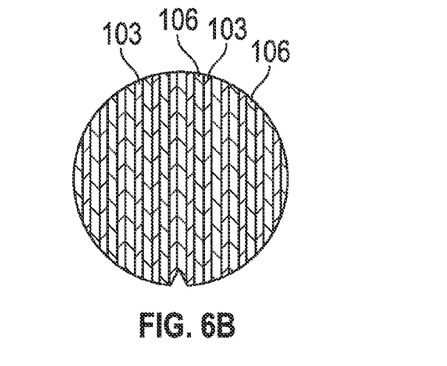

With reference to FIG. 6A and FIG. 6B (FIG. 6 et seq. include both a cross-sectional view and a top view of the semiconductor device, for ease of understanding of the described embodiments), the method continues with the planarization of the device to remove any excess oxide that was deposited on top of the device in the previous oxide deposition step shown in FIG. 5. In one example, chemical mechanical planarization techniques may be used to remove this excess oxide. As known in the art, the CMP process uses an abrasive and corrosive chemical slurry in conjunction with a polishing pad and retaining ring, typically of a greater diameter than the wafer. The CMP process parameters may be selected so as to stop the CMP process on the pad nitride layer 103.

Figure 7A:
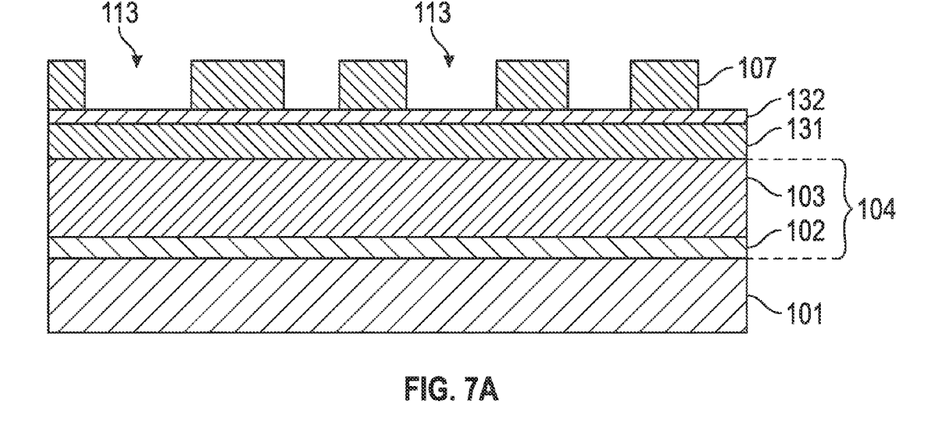
Figure 7B:
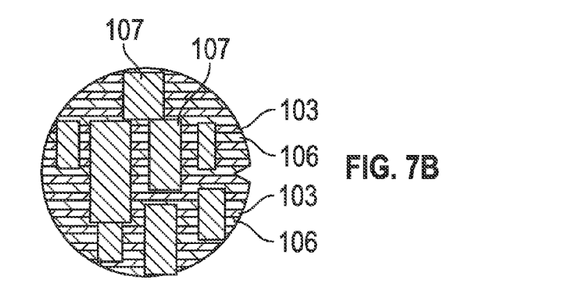

After the CMP process is complete, the exemplary method continues with the deposition of layers 131 and 132 in preparation for a tri-layer patterning step, as shown in FIGS. 7A and 7B. It is noted that the cross-sectional view in FIG. 7B has been rotated 90 degrees as compared to FIG. 6B such that the cross section is taken length-wise through one of the parallel, spaced apart features described above. Tri-layer patterning involves the deposition of a first layer 131 of an organic polymer material and a second layer 132 of an anti-reflective coating (ARC) material. Above layers 131 and 132, a third, photoresist material layer is deposited and patterned using conventional lithographic techniques. After development of the photoresist, the remaining photoresist features 107 define areas of the semiconductor device wherein FinFET features are to be formed, as will be described in greater detail below. Areas outside of features 107 are shown by void spaces 113.

Figure 8A:
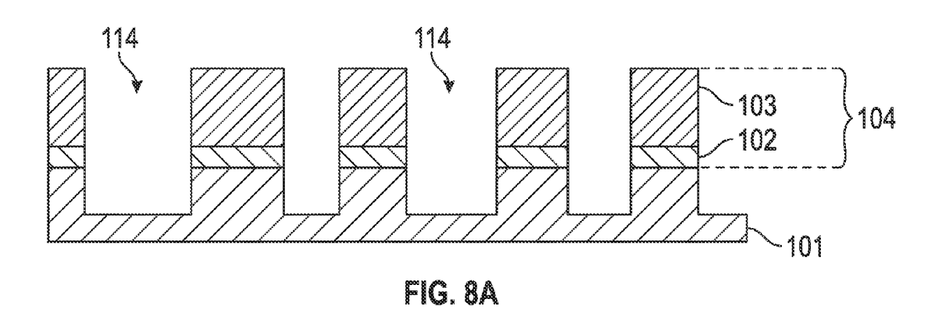
Figure 8B:
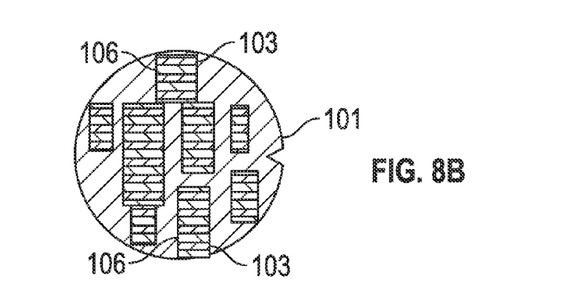

As shown thereafter in FIGS. 8A and 8B, the developed pattern 107 in the photoresist is transferred to the semiconductor device, and in particular layers 101, 102, and 103 thereof, by employing a suitable anisotropic etching technique. In one example, reactive ion etching (RIE) may be employed. The high-energy ions from the plasma attack the wafer surface and react with it, thereby extending the pattern of the photoresist 107 to form voids 114. The voids 114 extend completely through pad layers 102 and 103, and partially into substrate layer 101, for example about 5 nm to about 30 nm into substrate layer 101.

Figure 9A:
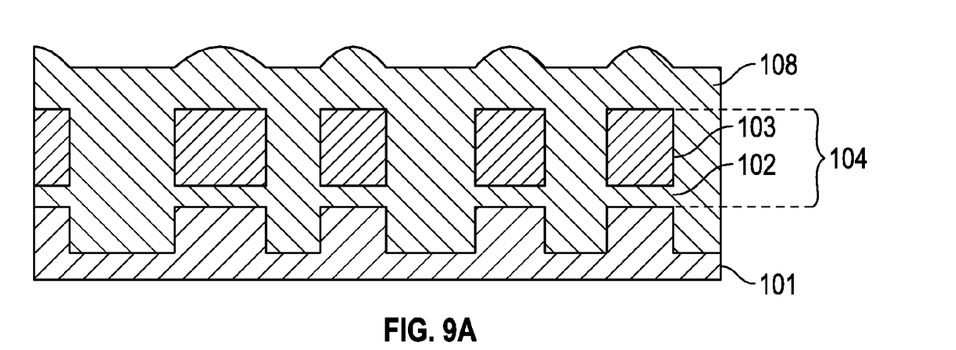
Figure 9B:
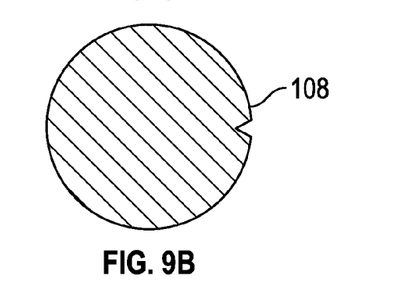
Figure 10A:
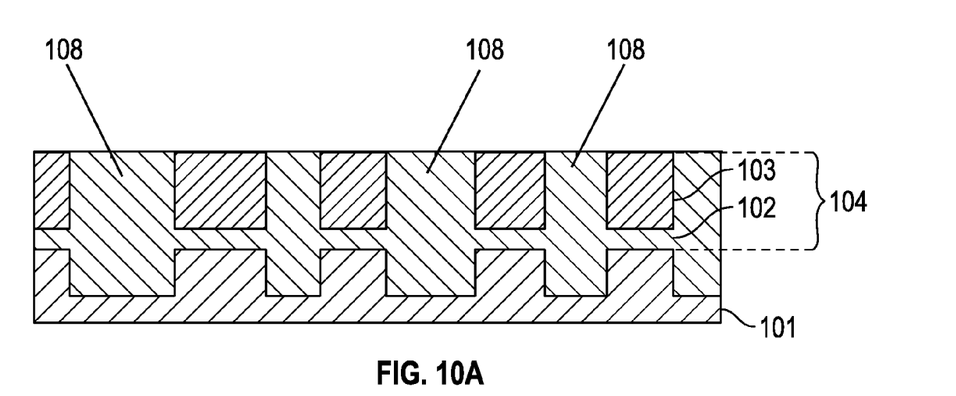
Figure 10B:
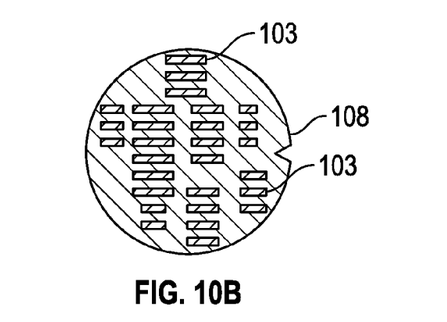

Subsequently, as shown in FIGS. 9A and 9B, the method continues with filling the voids 114 with an oxide material 108. The oxide fill may be accomplished by an HDP deposition process, a conventional CVD process, a low-pressure CVD (LPCVD) process, or any other suitable process known in the art for filling oxide. After the oxide 108 fill, the semiconductor device is again planarized using, for example, CMP, to remove any excess oxide that was deposited on top of the device in the previous oxide deposition step shown in FIGS. 10A and 10B. The CMP process parameters should be selected so as to stop the CMP process on the pad nitride layer 103.

Figure 11A:
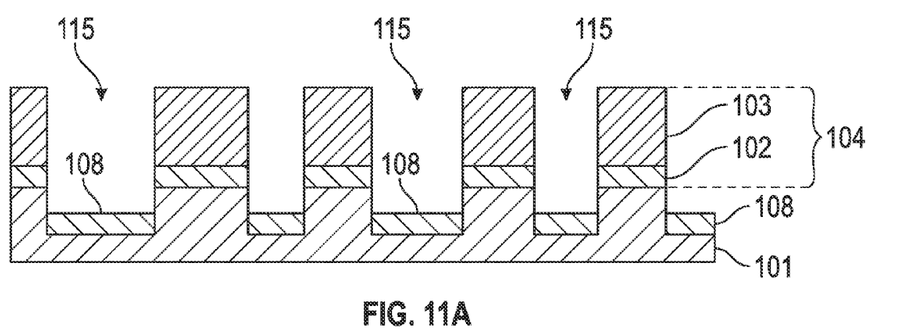
Figure 11B:
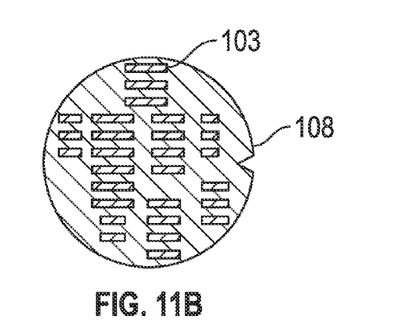
Figure 12A:
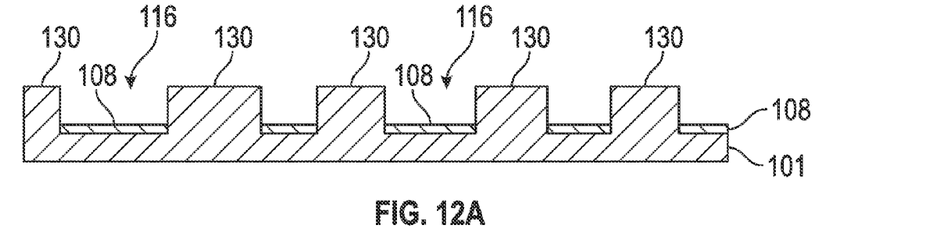
Figure 12B:
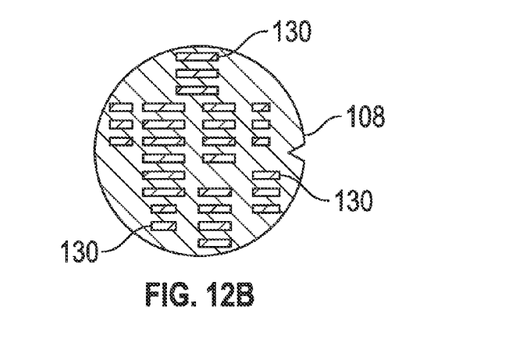

The exemplary method continues, as shown in FIGS. 11A and 11B, with an etching or deglazing process that is performed to ensure that the surface of the polish stop layer 103 is free of any remnants of the layer of insulating (oxide) material 108. This deglaze process may be performed by using a wet etching process, such as the application of dilute hydrofluoric acid (dHF), or a dry etching process may be performed, such as the RIE process described above. The deglazing or etching process forms void spaces 115 between the remaining features of layers 101, 102, and 103 Then, as shown in FIGS. 12A and 12B, one or more etching processes, wet or dry, are performed to remove the polish stop layer 103 and the protective layer 102. A single or a plurality of different etching processes and chemistries may, in various embodiments, be used to remove the layers 102, 103. Since layer 102 and the insulating fill oxide 108 are both oxides, it is expected that some of the remaining fill oxide 108 will be removed at the same time layer 102 is removed. Thus, as shown in FIGS. 12A and 12B, the remaining portion of oxide fill 108 is thinned. Void spaces 116 remain between the remaining features of layer 101 in the same pattern as void spaces 115, but with a smaller vertical profile due to the removal of layers 102 and 103.

Figure 13A:
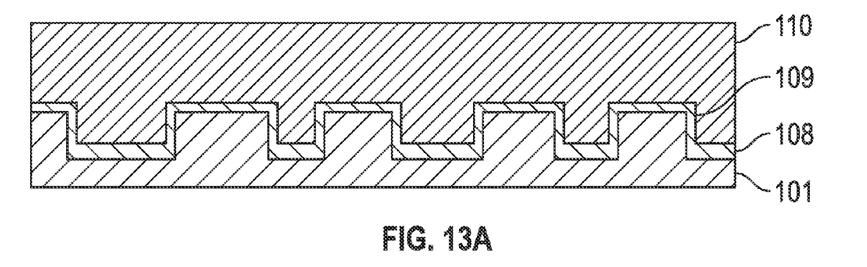
Figure 13B:
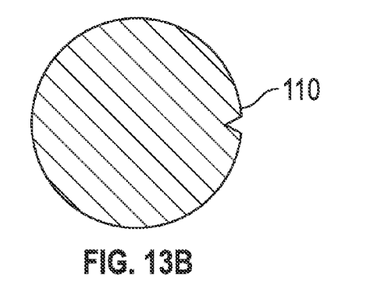
Figure 14A:
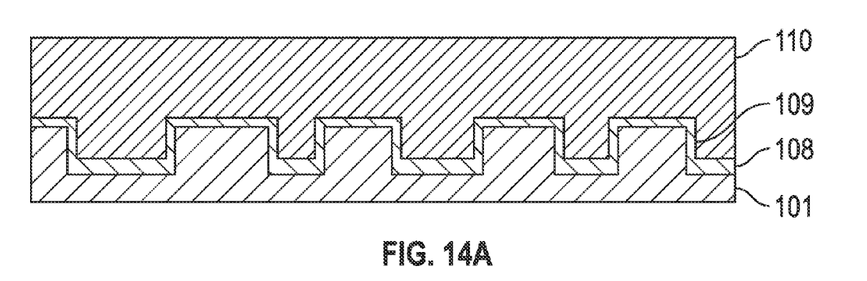
Figure 14B:
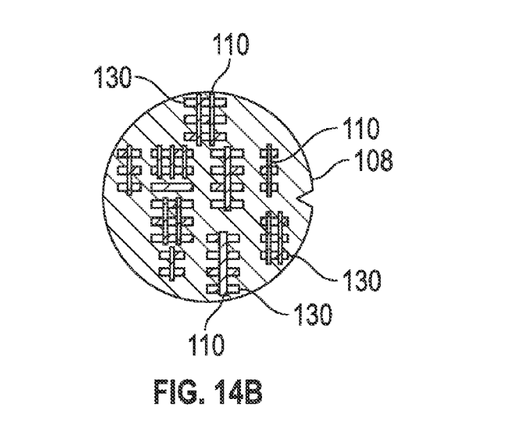
Figure 15A:
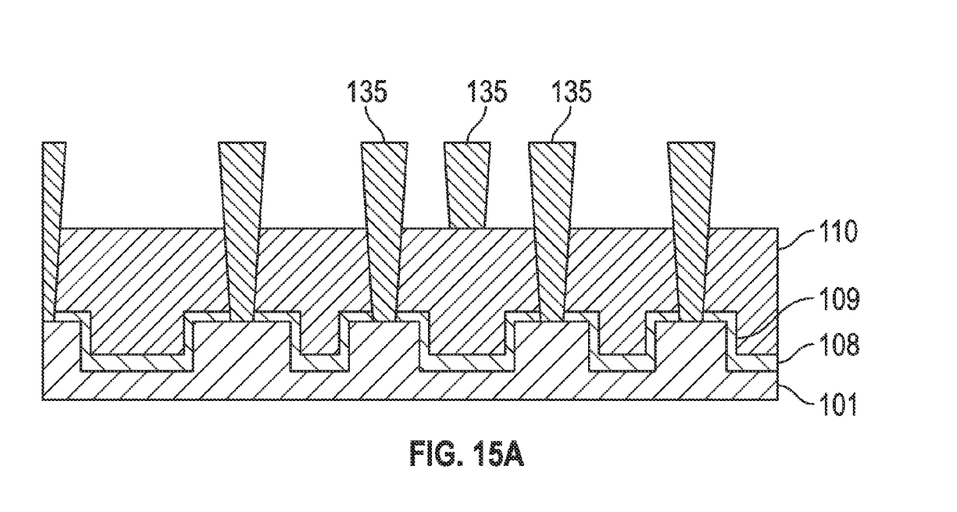
Figure 15B:
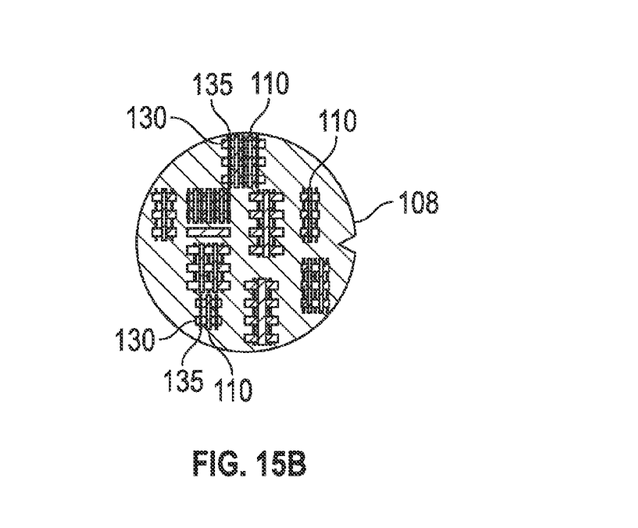

Thus, the semiconductor device at this stage of the fabrication process includes a plurality of zones or feature areas of closely spaced fins 130, which are electrically isolated from one another by insulation material 108. FinFET transistor structures may thereafter be completed in a conventional manner, for example, by depositing (FIGS. 13A and 13B) and patterning (FIGS. 14A and 14B) a gate electrode material 110 to form gate electrodes over the fin structures 130 according to the IC design. Further processing steps may also include providing (FIGS. 15A and 15B) electrical contacts 135 to source and drain regions (not illustrated) and to the gate electrodes structures 110. Non-illustrated further steps may also include depositing interlayer dielectrics, etching contact vias, filling the contact vias with conductive plugs, and the like as are well known to those of skill in the art of fabricating integrated circuits. Additional post-processing may include the formation of one or more metal layers (M1, M2, etc.) and interlayer dielectric layers therebetween to complete the various electrical connections in the integrated circuit. The present disclosure is not intended to exclude such further processing steps as are necessary to complete the fabrication of a functional integrated circuit, as are known in the art.

Thus, embodiments of the present disclosure provide methods for fabricating FinFET integrated circuit devices. The exemplary methods employ laser interference lithography to form a "stripe" pattern on a semiconductor substrate, and then employ a series of subsequent patterning steps to form FinFET regions on the semiconductor substrate in accordance with the IC layout design. In this manner, the smaller pitch features available from LIL techniques can be employed to fabricate semiconductors in a high-throughput semiconductor fabrication environment.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
providing a semiconductor substrate with a pad layer overlying the semiconductor substrate and a photoresist layer overlying the pad layer;
exposing the photoresist layer to a split laser beam to form a plurality of parallel linear void regions in the photoresist layer;
etching the pad layer and the semiconductor substrate beneath the plurality of parallel linear void regions to form a plurality of extended parallel linear void regions;
depositing a first dielectric material over the semiconductor substrate and into the extended parallel linear void regions to fill the extended parallel linear void regions with the first dielectric material;
depositing and patterning a photoresist material over the semiconductor substrate to cover a plurality of regions of the semiconductor substrate, the plurality of regions defining active regions of the integrated circuit;
etching portions of the pad layer, the first dielectric material, and the semiconductor substrate not covered by the photoresist material to form further void regions;
depositing a second dielectric material into the further void regions to fill the further void regions; and
removing the pad layer to expose the semiconductor substrate outside of the filled further void regions.

2. The method of claim 1, wherein providing the semiconductor substrate with the pad layer comprises providing a pad layer that comprises an oxide pad layer and/or a nitride pad layer.

3. The method of claim 1, wherein exposing the photoresist layer to the split laser beam comprises exposing the photoresist layer to a laser interference lithography procedure.

4. The method of claim 1, further comprising planarizing the first dielectric material subsequent to depositing the first dielectric material over the semiconductor substrate to fill the extended parallel linear void regions to form a planar surface comprising parallel linear first dielectric material regions between parallel linear pad material regions.

5. The method of claim 4, wherein patterning the photoresist material comprises patterning the photoresist material over the planar surface comprising parallel linear first dielectric material regions between parallel linear pad material regions.

6. The method of claim 5, wherein patterning the photoresist material comprises patterning the photo resist material over the active regions of the semiconductor substrate, the active regions delineating areas where fin structures are to be formed.

7. The method of claim 1, wherein etching the pad layer and the semiconductor substrate beneath the plurality of parallel linear void region comprises using a reactive ion etch.

8. The method of claim 1, wherein depositing the first dielectric material over the semiconductor substrate to fill the extended parallel linear void regions comprises depositing a silicon oxide dielectric material.

9. The method of claim 1, wherein etching portions of the pad layer, the first dielectric material, and the semiconductor substrate not covered by the photoresist material comprises using reactive ion etching.

10. The method of claim 1, wherein depositing the second dielectric material into the further void regions comprises depositing a silicon oxide dielectric material.

11. The method of claim 1, wherein depositing the second dielectric material into the further void regions comprises depositing the second dielectric material to fill the further void regions.

12. The method of claim 11, further comprising planarizing the second dielectric material subsequent to depositing the second dielectric material to form a planar surface comprising second dielectric material regions, pad material regions, and first dielectric material regions.

13. The method of claim 12, further comprising etching a first portion of both the first and second dielectric materials to re-form a portion of each of the plurality of extended parallel linear void regions and a portion of each of the further void regions, wherein a second portion of both the first and second dielectric materials remains in each of the plurality of extended parallel linear void regions and in each of the further void regions.

14. The method of claim 1, further comprising depositing a gate electrode material after removing the pad layer.

15. The method of claim 14, further comprising patterning the gate electrode material to form a gate structure over the semiconductor substrate outside of the further void regions.

16. The method of claim 15, further comprising forming a contact to the semiconductor substrate outside of the further void regions.

17. The method of claim 16, further comprising forming a contact to the gate structure.

18. The method of claim 1, wherein removing the pad layer to expose the semiconductor substrate outside of the further void regions comprises forming a plurality of fin structures outside of the further void regions.

19. A method for fabricating an integrated circuit comprising:
exposing a semiconductor substrate to a laser interference lithography line patterning process to form a plurality of parallel fin structures, each fin structure of the plurality of parallel fin structures being separated from an adjacent fin structure by a linear void region of a plurality of linear void regions;
forming a first dielectric material over the semiconductor substrate and into the plurality of parallel linear void regions such that the first dielectric material partially fills the parallel linear void regions with the first dielectric material;
etching portions of the first dielectric material and the semiconductor substrate to form further void regions, wherein portion of the semiconductor substrate outside of the further regions for active regions of the integrated circuit; and
forming a second dielectric material into the further void regions such that the second dielectric material partially fills the further void regions with the second dielectric material.

20. A method for fabricating an integrated circuit comprising:
providing a semiconductor substrate with a pad oxide layer and a pad nitride layer overlying the semiconductor substrate and a photoresist layer overlying the pad oxide and pad nitride layers;
exposing the photoresist layer to a split laser beam to form a plurality of parallel linear void regions in the photoresist layer;
etching the pad oxide and pad nitride layers and the semiconductor substrate beneath the plurality of parallel linear void regions to form a plurality of extended parallel linear void regions;

depositing a first silicon oxide dielectric material over the semiconductor substrate and into the extended parallel linear void regions to fill the extended parallel linear void regions with the first silicon oxide dielectric material;

planarizing the first silicon oxide dielectric material subsequent to depositing the first dielectric material over the semiconductor substrate to fill the extended parallel linear void regions to form a planar surface comprising parallel linear first silicon oxide dielectric material regions between parallel linear pad material regions depositing and patterning a photoresist material over the semiconductor substrate to cover a plurality of regions of the semiconductor substrate, the plurality of regions defining active regions of the integrated circuit;

etching portions of the pad oxide and pad nitride layers, the first silicon oxide dielectric material, and the semiconductor substrate not covered by the photoresist material to form further void regions;

depositing a second silicon oxide dielectric material into the further void regions to fill the further void regions;

planarizing the second silicon oxide dielectric material subsequent to depositing the second dielectric material to form a planar surface comprising second silicon oxide dielectric material regions, pad material regions, and first dielectric material regions;

etching a first portion of both the first and second dielectric materials to re-form a portion of each of the plurality of extended parallel linear void regions and a portion of each of the further void regions, wherein a second portion of both the first and second dielectric materials remains in each of the plurality of extended parallel linear void regions and in each of the further void regions;

removing the pad oxide and pad nitride layers to expose the semiconductor substrate outside of the filled further void regions; and forming a plurality of gate electrodes over the exposed semiconductor substrate.

\* \* \* \* \*